US011550182B2

(12) United States Patent
Greco et al.

(10) Patent No.: US 11,550,182 B2
(45) Date of Patent: Jan. 10, 2023

(54) COLOR FILTER AND DISPLAY DEVICE

(71) Applicant: Sony Corporation, Tokyo (JP)

(72) Inventors: Tonino Greco, Stuttgart (DE); Klaus Zimmermann, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 127 days.

(21) Appl. No.: 16/961,271

(22) PCT Filed: Dec. 20, 2018

(86) PCT No.: PCT/EP2018/086365
§ 371 (c)(1),
(2) Date: Jul. 10, 2020

(87) PCT Pub. No.: WO2019/137790
PCT Pub. Date: Jul. 18, 2019

(65) Prior Publication Data
US 2021/0063809 A1 Mar. 4, 2021

(30) Foreign Application Priority Data

Jan. 10, 2018 (EP) .................................... 18151045

(51) Int. Cl.
*G02F 1/00* (2006.01)
*G02F 1/1335* (2006.01)
*C01G 21/00* (2006.01)
*C07F 7/24* (2006.01)
*C07F 19/00* (2006.01)
(Continued)

(52) U.S. Cl.
CPC ..... *G02F 1/133514* (2013.01); *C01G 21/006* (2013.01); *C07F 7/24* (2013.01); *C07F 19/00* (2013.01); *G02F 1/133603* (2013.01); *C01P 2002/34* (2013.01); *C01P 2006/60* (2013.01); *G02B 5/201* (2013.01); *G02F 2203/055* (2013.01)

(58) Field of Classification Search
CPC ... G02F 1/133514; C01G 21/006; C07F 7/24; C07F 19/00; C01P 2002/34; C01P 2006/60
See application file for complete search history.

(56) References Cited

U.S. PATENT DOCUMENTS

| 8,193,705 B2 | 6/2012 | Manuela et al. |
| 2006/0055316 A1 | 3/2006 | Wu et al. |
| 2008/0203901 A1 | 8/2008 | Bukesov et al. |

(Continued)

FOREIGN PATENT DOCUMENTS

| CN | 106910836 A | 6/2017 |
| EP | 3258495 A1 | 12/2017 |

(Continued)

OTHER PUBLICATIONS

Adv Funct Materials—2017—Diroll—High-Temperature Photoluminescence of CsPbX3 X Cl Br I Nanocrystals (Year: 2017).*

(Continued)

Primary Examiner — Gerald J Sufleta, II
(74) Attorney, Agent, or Firm — Xsensus LLP

(57) ABSTRACT

The present disclosure pertains to a color filter for a display device, which has at least one color filter element for generating a predefined color in response to incident light, wherein the at least one color filter element includes a Perovskite material.

22 Claims, 2 Drawing Sheets

(51) Int. Cl.
    *G02F 1/13357*     (2006.01)
    *G02B 5/20*     (2006.01)

(56) References Cited

U.S. PATENT DOCUMENTS

| | | | |
|---|---|---|---|
| 2014/0176615 A1 | 6/2014 | Avci et al. | |
| 2016/0337605 A1* | 11/2016 | Ito | H01L 27/14634 |
| 2017/0012404 A1* | 1/2017 | Xing | H01S 5/36 |
| 2017/0186922 A1* | 6/2017 | Kim | C09K 11/703 |
| 2019/0331525 A1* | 10/2019 | Peters | G01J 1/1626 |
| 2020/0043672 A1* | 2/2020 | Mori | H01G 9/0029 |

FOREIGN PATENT DOCUMENTS

| | | |
|---|---|---|
| WO | 2017/108568 A1 | 6/2017 |
| WO | 2017/108962 A1 | 6/2017 |

OTHER PUBLICATIONS

International Search Report and Written Opinion dated Apr. 16, 2019 for PCT/EP2018/086365 filed on Dec. 20, 2018, 11 pages.
Chen, et al., "Going beyond the limit of an LCD's color gamut," Light: Science & Applications, Mar. 10, 2017, 29 pages.
Ko, et al., "Novel Quantum Dot Enhancement Film with a Super-wide Color Gamut for LCD displays," Journal of the Korean Physical Society, vol. 72, No. 1, Jan. 7, 2018, pp. 45-51.

* cited by examiner

COLOR FILTER AND DISPLAY DEVICE

CROSS-REFERENCE TO RELATED APPLICATIONS

The present application is based on PCT filing PCT/EP2018/086365, filed Dec. 20, 2018, which claims priority to EP 18151045.4, filed Jan. 10, 2018, the entire contents of each are incorporated herein by reference.

TECHNICAL FIELD

The present disclosure generally pertains to a color filter for a display device and a display device having such a color filter.

TECHNICAL BACKGROUND

With the development of science and technology, liquid crystal display technology also continues to advance correspondingly. TFT-LCDs (Thin Film Transistor-Liquid Crystal Displays) act as an important role in the field of display, since they are able to provide a good image display quality and low energy consumption. However, it is known that such displays may not easily cover the full gamut for the displayed color.

Furthermore, quantum dot displays are known, which are based on quantum dots, which emit light in a very narrow wavelength range and, thus, typically present a very pure color, and are known to be used for realizing fine adjustment. Further known characteristics of quantum dot display panels are improved brightness and vividness of the displayed pictures and reduced energy consumption compared with current display panels based on conventional technology.

Quantum dots are some semiconductor nanocrystals, which can be formed, for example, by a combination of zinc, cadmium, selenium and sulfur, as well as indium and phosphor atoms, and the grain diameter of the nanocrystals is typically less than 10 nanometers. Quantum dots have distinctive characteristics: they can emit light when subjected to an electrical or optical stimulation so as to produce bright light and present a pure color, and the color of the emitted light is determined by the composition material and the size of quantum dots. The smaller the size is, the closer to blue light it is, and the greater the size is, the closer to red light it is.

However, it is also known that quantum dots are expensive and involve a complicated synthesis method. Since the emission color is very sensitive to the size and size distribution of the quantum dots, generally, the synthesis reaction has to be controlled carefully.

For a conventional LCD display, typically, the color purity of a color filter needs to be improved if the color gamut needs to be expanded, but, typically, this degrades the transmittance of the color filter. In reply to this degrade, it is known to enhance the brightness of a backlight source, but this increases the power consumption of the LCD.

Although there exist various display technologies, it is generally desirable to provide a color filter for a display device and a display device with such a color filter.

SUMMARY

According to a first aspect, the disclosure provides a color filter for a display device, including at least one color filter element for generating a predefined color in response to incident light, wherein the at least one color filter element includes a Perovskite material.

According to a second aspect, the disclosure provides a display device, including a color filter, the color filter including at least one color filter element for generating a predefined color in response to incident light, wherein the at least one color filter element includes a Perovskite material; and a light source for illuminating the color filter.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
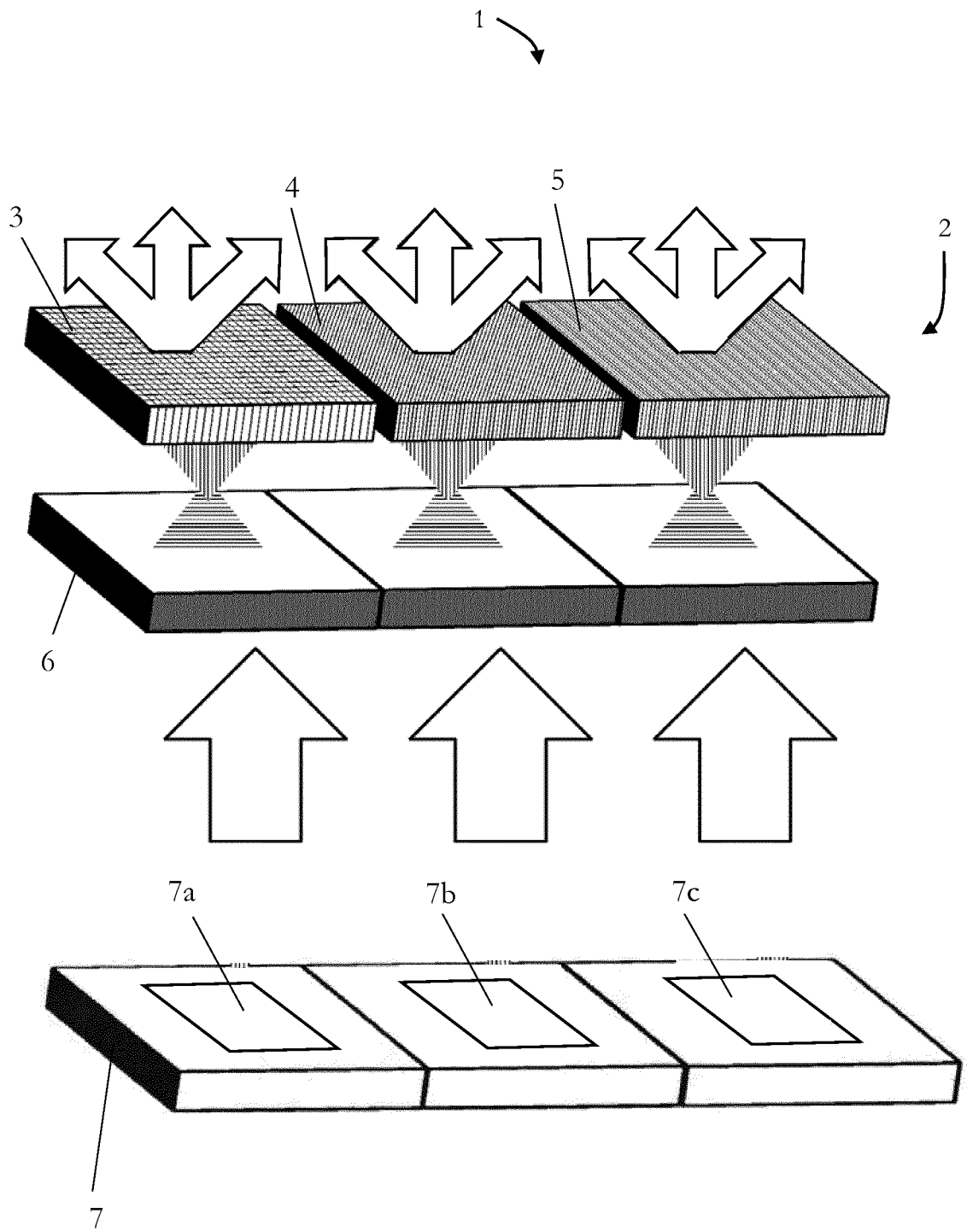
FIG. 1 illustrates a first embodiment of a display device with a color filter.

Before a detailed description of the embodiments under reference of FIG. 1 is given, general explanations are made.

As mentioned in the outset, generally, TFT-LCDs (Thin Film Transistor-Liquid Crystal Displays) and quantum dot displays are known, which are based on quantum dots, which emit light in a very narrow wavelength range. As discussed, for conventional LCD displays, typically, the color purity of a color filter needs to be improved if the color gamut needs to be expanded, but, typically, this degrades the transmittance of the color filter. In reply to this degrade, it is known to enhance the brightness of a backlight source, but this increases the power consumption of the LCD.

It has been recognized that using a Perovskite material instead of quantum dots is useful in some embodiments, since the emission color can be easily controlled by the composition of the Perovskite material.

Hence, some embodiments pertain to a color filter for a display device, including at least one color filter element for generating a predefined color in response to incident light, wherein the at least one color filter element includes a Perovskite material.

In some embodiments, the application of Perovskite materials to displays can overcome the technical issues discussed above.

In some embodiments, the perovskite color filter overcomes the drawbacks of an existing color filter, which is typically limited in its gamut and affects the display quality of final products, increases the production cost, etc. Thus, in some embodiments, the color filter for a display device in this disclosure has a large gamut, does not affect the display quality and allows decreasing production costs.

Beyond that, the perovskite color filter may not need any passivation layer, as it is known for quantum dots, in order to achieve a high luminescence quantum yield.

In some embodiments, the Perovskite material can be processed by wet-chemical printing methods resulting in reduced production costs.

The display device may be any type of display device, which is used for displaying image data, wherein in some embodiments the display device is based on the liquid crystal display LCD technology.

The incident light may origin from a light source, e.g. a backlight source (without limiting the present disclosure in that regard) which emits light having a predefined wavelength, such as blue, red, green, etc. The backlight source may include any type of light source, but in some embodiments, it includes LEDs (light emitting diodes) for generating the light and it may include blue LEDs which generate blue light, which then incidents on the color filter.

In some embodiments, the color filter includes more than one color filter element, e.g. two, three or more. In some embodiments, it includes a blue color filter element, a red color filter element, and a green color filter element, or a subset of that, e.g. a red and green color filter element, which may depend also on the color of the light source which is used for illuminating the color filter. Hence, in some embodiments, where the light source has a predefined color, a color filter element for the color of the light source may be transparent and, thus, may not filter the light originating from the light source.

Moreover, the (Perovskite) color filter may be implemented with a (base) substrate (e.g. glass or the like) and a pixel layer provided on the base substrate (e.g. glass) (or the color filter (the color filter element(s)) may be arranged on the substrate). The pixel layer may include a plurality of pixels, wherein each of the pixels includes a plurality (e.g. three) of color sub-pixels (i.e. color elements) of different colors (e.g. blue, green and red), and at least one of these color sub-pixel includes a Perovskite material.

The Perovskite material of the color filter element is excited by the incident light and generates light in response to the excitation caused by the incident light. The Perovskite material is such chosen that the generated light corresponds to the wanted color, e.g. red, green or blue. Hence, by irradiating the at least one color element including the Perovskite material, the corresponding light is generated, e.g. blue, green or red without limiting the present disclosure in that regard.

In other words, in some embodiments, a color of light generated by the perovskite material after the perovskite material is excited by incident light is the same as a color which the corresponding color sub-pixel is intended to present.

In some embodiments, the Perovskite material is based on the formula $ABX_3$, wherein the A is an inorganic alkali or an organic alkyl ammonium, B is a metal or a rear earth, and X is of the group of halogens. The A may be at least one of K, Rb, Cs, $CH_3NH_3$, $CH_3CH_2NH_3$, $CHN_2H_3$, the B may be at least one of Y, Zr, Hf, Sn, Ce, Tc, Al, SC, V, Cr, Mn, Fe, Co, Ga, Mg, Ni, Cu, Zn, Nb, and the X may be at least one of Cl, Br, I.

Thus, in some embodiments, the Perovskite material with the general formula $ABX_3$ has a band gab, which is tunable by the composition of the X inorganic alkali or an organic alkyl ammonium, B is a metal or a rare earth, and X is of the group of -anions and to some extend also by the A-cations. The X-anions may be $Cl^-, Br^-, I^-$, and mixtures thereof. The A-cations may include or may consist of inorganic alkali cations $K^+, Rb^+, Cs^+$ or of organic alkyl ammonium cations, such as methyl or ethyl ammonium, and formamidinium: $CH_3NH_3^+$, $CH_3CH_2NH_3^+$, $CHN_2H_3^+$. Thus, in some embodiments, it is possible to generate a Perovskite material which selectively absorbs and emits in a specific spectral region. By tuning the band gap based on the X-anions, and to some extend by the A-cations, the synthesis procedure may be much easier and more economic compared to other solutions.

In some embodiments, the at least one color filter element is a blue light spectrum (e.g. 450-495 nm) color filter, wherein the Perovskite material may include at least one of the following: $CsPbCl_2Br$, $CH_3NH_3CsPbCl_2Br$, $CHNHNH_2PbCl_2Br$.

In some embodiments, the at least one color filter element is a green light spectrum (e.g. 495-570 nm) color filter, wherein the Perovskite material may include at least one of the following: $CsPbBr_3$, $CH_3NH_3CsPbBr_3$, or $Cs_{0.5}Rb_{0.5}PbBr_3$.

In some embodiments, the at least one color filter element is a red light spectrum (e.g. 620-750 nm) color filter, wherein the Perovskite material may include at least one of the following: $CsPbI_3$, $CH_3NH_3CsPbI_3$, $CH_3NH_3SnBr_{1.5}I_{1.5}$, $CsSnBr_{1.5}I_{1.5}$.

In some embodiments, the color filter further comprises a light absorption layer (or optical filtering layer) on the at least one color filter element for absorbing light which incidents on and penetrates through the at least one color filter element. The light absorption layer may be provided on the base substrate and it may to correspond to the color sub-pixel formed of the perovskite material. The light absorption layer may absorb the incident light that fails to excite the perovskite material but is transmitted through the color sub-pixel (i.e. which may not be absorbed). The light absorption layer may also absorb stray light. The light absorption layer may include a standard blue color filter, or the like.

Some embodiments pertain to a display device including a color filter as described herein, the color filter, as discussed, including at least one color filter element for generating a predefined color in response to incident light, wherein the at least one color filter element includes a Perovskite material. The display device also includes a light source for illuminating the color filter.

The display device may be a liquid crystal display.

The light source, may be based on any type of light source, but in some embodiments, it includes LEDs or also Perovskite material. Moreover, the light source may be a backlight source of a liquid crystal display. By using Perovskite material for the light source, in some embodiments, the color purity may be improved without increasing color concentration of a color filter, and the power consumption will not be raised much, either.

As discussed, on some embodiments, the display device may include a substrate on which the color filter is arranged, and it may include a pixel layer including multiple pixels, each including, e.g., three sub-pixels, as discussed above.

In some embodiments, a wavelength of light emitted by the (back-)light source is smaller than a wavelength of light generated by the perovskite material in the color filter after the perovskite material is excited.

For example, the (back-)light source may be a blue light source (e.g. using blue LEDs). Further, when, for example, one color filter element is a red sub-pixel including red Perovskite material, another color filter element is a green sub-pixel including green Perovskite material, and a third color filter element is a blue sub-pixel formed by a transparent material (e.g. glass), the region of the blue sub-pixel may have no optical filtering layer provided therein, such that the blue light of the blue light source penetrates the blue sub-pixel without being filtered, while for the red sub-pixel and the green sub-pixel the blue light excites the corresponding red or green Perovskite material, thereby generating red or green light, while the blue light of the light source is absorbed (at least partially) by the corresponding red or green pixel.

As discussed, the at least one color filter element is a blue light spectrum color filter, wherein the Perovskite material may include at least one of the following: $CsPbCl_2Br$, $CH_3NH_3CsPbCl_2Br$, $CHNHNH_2PbCl_2Br$. The at least one color filter element is a green light spectrum color filter, wherein the Perovskite material may include at least one of the following: $CsPbBr_3$, $CH_3NH_3CsPbBr_3$, or $Cs_{0.5}Rb_{0.5}PbBr_3$. The at least one color filter element is a red light spectrum color filter, wherein the Perovskite material may include at least one of the following: $CsPbI_3$, $CH_3NH_3CsPbI_3$, $CH_3NH_3SnBr_{1.5}I_{1.5}$, $CsSnBr_{1.5}I_{1.5}$. As discussed, the Perovskite material may be based on the formula $ABX_3$, wherein the A is an inorganic alkali or an organic alkyl ammonium, B is a metal or a rare earth, and X may be of the group of halogens, wherein A may be at least one of K, Rh, Cs, $CH_3NH_3$, $CH_3CH_2NH_3$, $CHN_2H_3$, B may be at least one of Y, Zr, Hf, Sn, Ce, Tc, Al, SC, V, Cr, Mn, Fe, Co, Ga, Mg, Ni, Cu, Zn, Nb, and X may be at least one of Cl, Br, I. In some embodiments, the display device further includes a light absorption layer on the at least one color filter element for absorbing light which incidents on and penetrates through the at least one color filter element, as discussed above.

Returning to FIG. 1, there is illustrated a first embodiment of a display device 1, which is a liquid crystal device, having a color filter 2.

The color filter 2 has three color filter elements, namely a first color filter element 3 which is transparent (e.g. made of glass) and which does not have any (significant) color filtering characteristic. The color filter 2 has a second color filter element 4, which is a green color filter element 4 which is made, for example, of the green Perovskite material $CsPbBr_3$.

The color filter 2 has also a third color filter element 5, which is a red color filter element 5 which is made, for example, of the red Perovskite material $CsPbI_3$.

The three color filter elements 3, 4, and 5 form sub-pixels of one pixel which includes the three color filter elements 3, 4, and 5.

The display device 1 has a plurality of such pixels for displaying images as it is generally known for a liquid crystal device. The pixels may be in a pixel layer which is arranged on a transparent substrate.

Furthermore, a polarizer 6 is provided which polarizes blue light which is emitted from a backlight source 7 which has a plurality of blue LEDs, wherein FIG. 1 exemplary shows three blue LEDs 7a, 7b and 7c without limiting the present disclosure in that regard.

During operation of the display device 1, the backlight source 7 generates and emits blue light which travels through the polarizer 6, whereby it is polarized. Then the polarized blue light incidents on the color filter elements 3, 4, and 5, wherein the polarized blue light penetrates the transparent color filter element 3 without being filtered. The polarized blue light is absorbed by the color filter elements 4 and 5 and excites the Perovskite material accordingly, such that the color filter element 4 emits green light and the color filter element 5 emits red light.

Thereby, the colors blue, green and red are provided.

Figure 2:
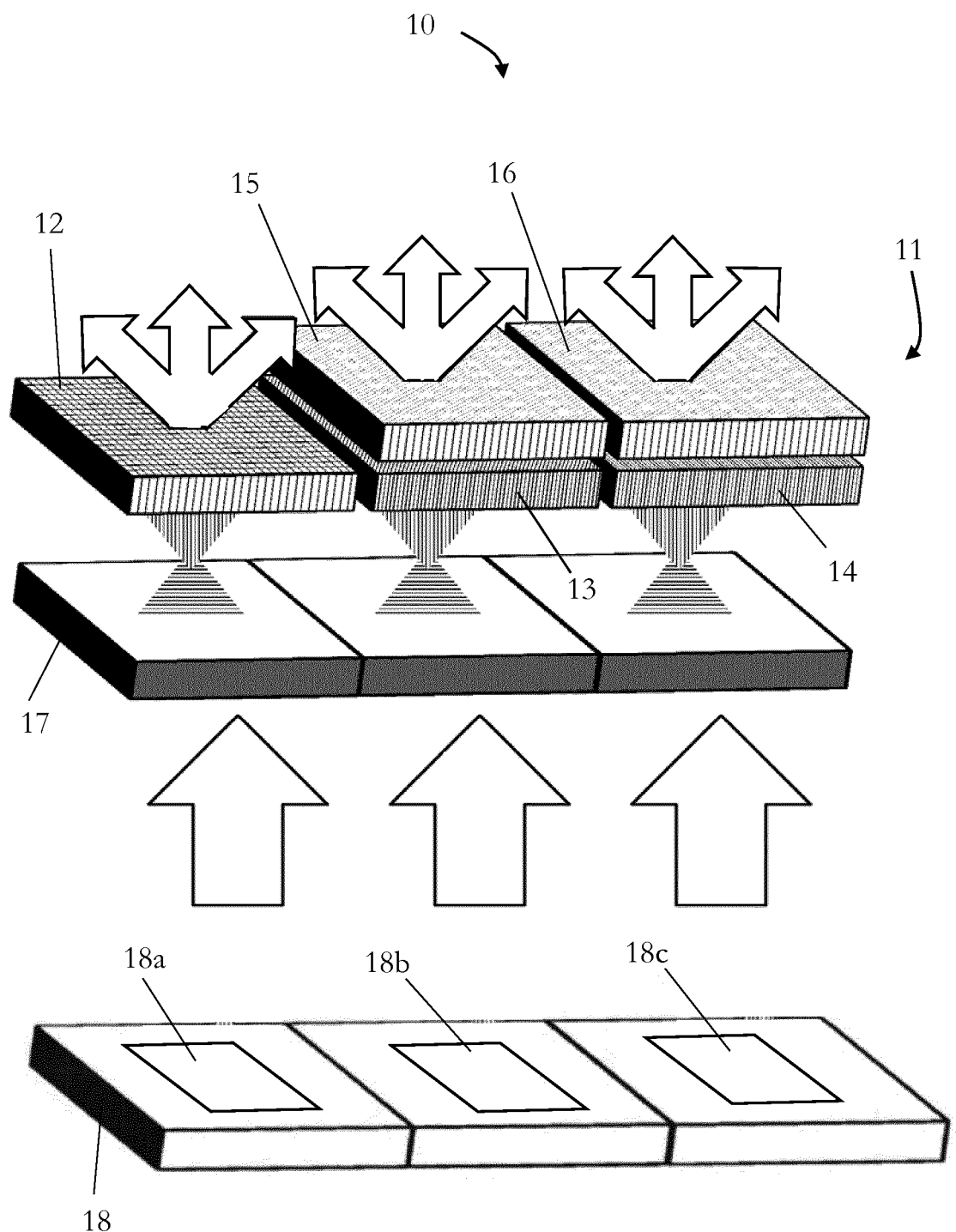
FIG. 2 illustrates a second embodiments of a display device with a color filter.

FIG. 2 illustrates a second embodiment of a display device 10, which is a liquid crystal device, having a color filter 11.

The general setup of the display device 10 is very similar to the setup of display device 1 except for that the display device 10 has blue light absorption elements 15 and 16, as will be discussed further below.

The color filter 11 has three color filter elements, namely a first color filter element 12 which is transparent (e.g. made of glass) and which does not have any (significant) color filtering characteristic.

The color filter 11 has a second color filter element 13, which is a green color filter element 13 which is made, for example, of the green Perovskite material $CsPbBr_3$.

The color filter 11 has also a third color filter element 14, which is a red color filter element 14 which is made, for example, of the red Perovskite material $CsPbI_3$.

The three color filter elements 12, 13 and 14 form sub-pixels of one pixel which includes the three color filter elements 12, 13, and 14.

The display device 10 has a plurality of such pixels for displaying images as it is generally known for a liquid crystal device. The pixels may be in a pixel layer which is arranged on a transparent substrate.

Furthermore, a polarizer 17 is provided which polarizes blue light which is emitted from a backlight source 18 which has a plurality of blue LEDs, wherein FIG. 2 exemplary shows three blue LEDs 18a, 18b and 18c without limiting the present disclosure in that regard.

Additionally, as mentioned, on top of the color filter elements 13 and 14, which are made of the Perovskite material, a light absorption layer is provided, which is illustrated with two light absorption elements 15 and 16 which are adapted in its size to the color filter elements 13 and 14 and which are adapted to absorb the blue light which is emitted by the backlight source 18.

During operation of the display device 10, the backlight source 18 generates and emits blue light which travels through the polarizer 17, whereby it is polarized. Then the polarized blue light incidents on the color filter elements 12, 13, and 14, wherein the polarized blue light penetrates the transparent color filter element 12 without being filtered. The polarized blue light is absorbed by the color filter elements 13 and 14 and excites the Perovskite material accordingly, such that the color filter element 13 emits green light and the color filter element 14 emits red light.

Blue light originating from the backlight source 18, which is not absorbed during penetration of the color filter elements 13, and 14, respectively, or blue light which penetrates the transparent filter element 12 and strays into the neighboring color filter elements, e.g. color filter element 13, is absorbed by the blue light absorption layer and its elements 15 and 16, respectively, which are arranged on top of the color filter elements 13 and 14.

Note that the present technology can also be configured as described below.

(1) A color filter for a display device, comprising at least one color filter element for generating a predefined color in response to incident light, wherein the at least one color filter element includes a Perovskite material.

(2) The color filter of (1), wherein the at least one color filter element is a blue light spectrum color filter.

(3) The color filter of (2), wherein the Perovskite material includes at least one of the following: $CsPbCl_2Br$, $CH_3NH_3CsPbCl_2Br$, $CHNHNH_2PbCl_2Br$.

(4) The color filter of anyone of (1) to (3), wherein the at least one color filter element is a green light spectrum color filter.

(5) The color filter of (4), wherein the Perovskite material includes at least one of the following: $CsPbBr_3$, $CH_3NH_3CsPbBr_3$, or $Cs_{0.5}Rb_{0.5}PbBr_3$.

(6) The color filter of anyone of (1) to (5), wherein the at least one color filter element is a red light spectrum color filter.

(7) The color filter of (6), wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.

(8) The color filter of anyone of (1) to (7), wherein the Perovskite material is based on the formula $ABX_3$, wherein the A is an inorganic alkali or an organic alkyl ammonium, B is a metal or a rare earth, and X is of the group of halogens.

(9) The color filter of (8), wherein A is at least one of K, Rb, Cs, $CH_3NH_3$, $CH_3CH_2NH_3$, $CHN_2H_3$, B is at least one of Y, Zr, Hf, Sn, Ce, Tc, Al, SC, V, Cr, Mn, Fe, Co, Ga, Mg, Ni, Cu, Zn, Nb, and Xis at least one of Cl, Br, I.

(10) The color filter of anyone of (1) to (9), further comprising a light absorption layer on the at least one color filter element for absorbing light which incidents on and penetrates through the at least one color filter element.

(11) A display device, comprising:
a color filter, the color filter including at least one color filter element for generating a predefined color in response to incident light, wherein the at least one color filter element includes a Perovskite material; and
a light source for illuminating the color filter.

(12) The display device of (11), wherein the at least one color filter element is a blue light spectrum color filter.

(13) The display device of (12), wherein the Perovskite material includes at least one of the following: $CsPbCl_2Br$, $CH_3NH_3CsPbCl_2Br$, $CHNHNH_2PbCl_2Br$.

(14) The display device of anyone of (11) to (13), wherein the at least one color filter element is a green light spectrum color filter.

(15) The display device of (14), wherein the Perovskite material includes at least one of the following: $CsPbBr_3$, $CH_3NH_3CsPbBr_3$, or $Cs_{0.5}Rb_{0.5}PbBr_3$.

(16) The display device of anyone of (11) to (15), wherein the at least one color filter element is a red light spectrum color filter.

(17) The display device of (16), wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.

(18) The display device of anyone of (11) to (17), wherein the Perovskite material is based on the formula $ABX_3$, wherein the A is an inorganic alkali or an organic alkyl ammonium, B is a metal or a rare earth, and X is of the group of halogens.

(19) The display device of (18), wherein A is at least one of K, Rb, Cs, $CH_3NH_3$, $CH_3CH_2NH_3$, $CHN_2H_3$, B is at least one of Y, Zr, Hf, Sn, Ce, Tc, Al, SC, V, Cr, Mn, Fe, Co, Ga, Mg, Ni, Cu, Zn, Nb, and X is at least one of Cl, Br, I.

(20) The display device of anyone of (11) to (19), further comprising a light absorption layer on the at least one color filter element for absorbing light which incidents on and penetrates through the at least one color filter element.

The invention claimed is:

1. A color filter for a display device, comprising:
a first color filter element for generating a predefined color in response to incident light, wherein
the first color filter element includes a Perovskite material that is not a quantum dot material,
the first color filter element is a red light spectrum color filter, and
the color filter outputs all components for generating white light.

2. The color filter of claim 1, further comprising a second color filter element that includes a Perovskite material that is not a quantum dot material, wherein the one second color filter element is a blue light spectrum color filter.

3. The color filter of claim 2, wherein the Perovskite material includes at least one of the following: $CsPbCl_2Br$, $CH_3NH_3CsPbCl_2Br$, $CHNHNH_2PbCl_2Br$.

4. The color filter of claim 1, further comprising a second color filter element that includes a Perovskite material that is not a quantum dot material, wherein the second color filter element is a green light spectrum color filter.

5. The color filter of claim 4, wherein the Perovskite material includes at least one of the following: $CsPbBr_3$, $CH_3NH_3CsPbBr_3$, or $Cs_{0.5}Rb_{0.5}PbBr_3$.

6. The color filter of claim 1, wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.

7. The color filter of claim 1, wherein the Perovskite material is based on the formula $ABX_3$, wherein the A is an inorganic alkali or an organic alkyl ammonium, B is a metal or a rare earth, and X is of the group of halogens.

8. The color filter of claim 7, wherein A is at least one of K, Rb, Cs, $CH_3NH_3$, $CH_3CH_2NH_3$, $CHN_2H_3$, B is at least one of Y, Zr, Hf, Sn, Ce, Tc, Al, SC, V, Cr, Mn, Fe, Co, Ga, Ni, Cu, Zn, Nb, and X is at least one of Cl, Br, I.

9. The color filter of claim 1, further comprising a light absorption layer on the first color filter element for absorbing light which incidents on and penetrates through the first color filter element.

10. A display device, comprising:
a color filter, the color filter including first color filter element for generating a predefined color in response to incident light, wherein
the first color filter element includes a Perovskite material that is not a quantum dot material,
the first color filter element is a red light spectrum color filter, and
the color filter outputs all components for generating white light; and
a light source for illuminating the color filter, wherein the incident light from the light source is a subset of white light.

11. The display device of claim 10, further comprising a second color filter element that includes a Perovskite material that is not a quantum dot material, wherein the second color filter element is a blue light spectrum color filter.

12. The display device of claim 11, wherein the Perovskite material includes at least one of the following: $CsPbCl_2Br$, $CH_3NH_3CsPbCl_2Br$, $CHNHNH_2PbCl_2Br$.

13. The display device of claim 10, further comprising a second color filter element that includes a Perovskite material that is not a quantum dot material, wherein the second color filter element is a green light spectrum color filter.

14. The display device of claim 13, wherein the Perovskite material includes at least one of the following: $CsPbBr_3$, $CH_3NH_3CsPbBr_3$, or $Cs_{0.5}Rb_{0.5}PbBr_3$.

15. The display device of claim 10, wherein the Perovskite material includes at least one of the following: $CsPbI_3$, $CH_3NH_3CsPbI_3$, $CH_3NH_3SnBr_{1.5}I_{1.5}$, $CsSnBr_{1.5}I_{1.5}$.

16. The display device of claim 10, wherein the Perovskite material is based on the formula $ABX_3$, wherein the A is an inorganic alkali or an organic alkyl ammonium, B is a metal or a rare earth, and X is of the group of halogens.

17. The display device of claim 16, wherein A is at least one of K, Rb, Cs, $CH_3NH_3$, $CH_3CH_2NH_3$, $CHN_2H_3$, B is at least one of Y, Zr, Hf, Sn, Ce, Tc, Al, SC, V, Cr, Mn, Co, Ga, Mg, Ni, Cu, Zn, Nb, and X is at least one of Cl, Br, I.

18. The display device of claim 10, further comprising a light absorption layer on the first color filter element for absorbing light which incidents on and penetrates through the color filter element.

19. The display device of claim 10, wherein the subset of white light is a second color, different from the predefined color.

20. The display device of claim 19, wherein the color filter includes no filter or a transparent filter for the second color.

21. The color filter of claim 1, wherein the color filter includes no filter or a transparent filter for a second color, different from the predefined color.

22. The color filter of claim 21, wherein the incident light has a wavelength region corresponding to the second color.

* * * * *